(12) United States Patent
Yun

(10) Patent No.: US 7,835,180 B2
(45) Date of Patent: Nov. 16, 2010

(54) SEMICONDUCTOR MEMORY DEVICE

(75) Inventor: Tae-Sik Yun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 128 days.

(21) Appl. No.: 12/347,520

(22) Filed: Dec. 31, 2008

(65) Prior Publication Data

US 2010/0110806 A1    May 6, 2010

(30) Foreign Application Priority Data

Nov. 6, 2008    (KR) ............... 10-2008-0110090

(51) Int. Cl.
*G11C 11/34* (2006.01)
(52) U.S. Cl. ................. 365/185.11; 365/230.03; 365/185.19; 365/189.02
(58) Field of Classification Search ........... 365/185.11, 365/230.03, 185.19, 189.02
See application file for complete search history.

(56) References Cited

U.S. PATENT DOCUMENTS

2002/0018394 A1 * 2/2002 Takahashi ................. 365/233

FOREIGN PATENT DOCUMENTS

JP    11-162161    6/1999
KR    10-2008-0052047 A    6/2008

OTHER PUBLICATIONS

Notice of Preliminary Rejection issued from Korean Intellectual Property Office on Mar. 25, 2010.

* cited by examiner

*Primary Examiner*—Amir Zarabian
*Assistant Examiner*—Jason Lappas
(74) *Attorney, Agent, or Firm*—IP & T Group LLP

(57) ABSTRACT

A semiconductor memory device includes a plurality of banks, each configured to receive a bank operation control signal and perform predetermined operations in response to the received bank operation control signal, a plurality of bank control blocks, each configured to receive a bank sequential signal and generate the plurality of bank operation control signals in response to enable periods of the received bank sequential signal, and a bank sequential signal generating block configured to generate the plurality of bank sequential signals each having a multiplicity of enable periods that are sequential in response to a command signal.

32 Claims, 9 Drawing Sheets

SEMICONDUCTOR MEMORY DEVICE

CROSS-REFERENCE TO RELATED APPLICATIONS

The present invention claims priority of Korean patent application number 10-2008-0110090, filed on Nov. 6, 2008, which is incorporated by reference in its entirety.

BACKGROUND OF THE INVENTION

The present invention relates to a method for controlling a plurality of banks included in a semiconductor memory device, and more particularly, to a method for generating signals for controlling each of the plurality of banks employing one control circuit.

In general, a semiconductor memory device is used to store a plurality of data and to provide desired data among the stored data. That is, an operation of the semiconductor memory device is classified into a data write operation for storing data inputted from the exterior and a data read operation for outputting data stored in the semiconductor memory device to the exterior.

Meanwhile, in a typical semiconductor memory device such as a dynamic random access memory (DRAM) device which is a volatile memory device, in order to store data inputted from the exterior in a cell or output data stored in a cell to the exterior, the semiconductor memory device should perform various operations including an active operation, a read/write operation and a precharge operation.

Herein, the active operation and the read/write operation are operations for selecting a certain cell among a plurality of cells included in the semiconductor memory device, and outputting data stored in the certain cell to the exterior or storing data provided from the exterior in the certain cell. Meanwhile, the precharge operation is an operation for making the semiconductor memory device ready for the active operation and the read/write operation.

Therefore, in order to output data stored in the semiconductor memory device to the exterior once or store data from the exterior in the semiconductor memory device once, a time for performing the active operation, the read/write operation and the precharge operation should be secured.

Accordingly, the semiconductor memory device employs a method capable of effectively performing a data input/output operation. That is, the semiconductor memory device includes a plurality of banks obtained by grouping a plurality of cells included in the semiconductor memory device at a certain unit, wherein each bank performs the data input/output operation independently.

FIG. 1 illustrates a block diagram of a conventional semiconductor memory device including a plurality of banks. As shown, the conventional semiconductor memory device includes a plurality of banks BANK0-BANK7, a plurality of bank control blocks BANK0_CONTROL-BANK7_CONTROL, and a bank operation mode signal generating block 100.

The plurality of banks BANK0-BANK7 each performs various operations in response to a corresponding one of a plurality of bank operation control signals BANK0_CONT<0:N>-BANK7_CONT<0:N>. The plurality of bank control blocks BANK0_CONTROL-BANK7_CONTROL generates the plurality of bank operation control signals BANK0_CONT<0:N>-BANK7_CONT<0:N> each of which has a plurality of enable periods that are sequential in response to a plurality of bank operation mode signals ACT_PCG_CONT<0>-ACT_PCG_CONT<7>. The bank operation mode signal generating block 100 generates the plurality of bank operation mode signals ACT_PCG_CONT<0>-ACT_PCG_CONT<7> in response to an active command ACT_CMD, a precharge command PCG_CMD and a bank address BANK_ADDR<0:7>.

Under a condition where the active operation should be performed in response to the enabled active command ACT_CMD, the bank operation mode signal generating block 100 selects one of the plurality of bank operation mode signals ACT_PCG_CONT<0>-ACT_PCG_CONT<7> corresponding to the bank address BANK_ADDR<0:7>. The bank operation mode signal generating block 100 enables the selected bank operation mode signal while not enabling the unselected bank operation mode signals. Likewise, in response to the enabled precharge command PCG_CMD, the bank operation mode signal generating block 100 selects one of the plurality of bank operation mode signals ACT_PCG_CONT<0>-ACT_PCG_CONT<7> corresponding to the bank address BANK_ADDR<0:7>. The bank operation mode signal generating block 100 disables the selected bank operation mode signal while not disabling the unselected bank operation mode signals.

The bank control blocks BANK0_CONTROL-BANK7_CONTROL generates the bank operation control signals BANK0_CONT<0:N>-BANK7_CONT<0:N> in response to the enabled bank operation mode signals ACT_PCG_CONT<0>-ACT_PCG_CONT<7>, respectively. The bank operation control signals BANK0_CONT<0:N>-BANK7_CONT<0:N> have a plurality of sequential enable periods to perform the active operation in the plurality of banks BANK0-BANK7. Likewise, in response to the disabled bank operation mode signals ACT_PCG_CONT<0>-ACT_PCG_CONT<7>, the bank operation control signals BANK0_CONT<0:N>-BANK7_CONT<0:N> are generated to perform the precharge operation in the plurality of banks BANK0-BANK7.

FIGS. 2A and 2B illustrate detailed circuit diagrams of the bank operation mode signal generating block and the plurality of bank control blocks described in FIG. 1, respectively.

Referring to FIG. 2A, in response to the active command ACT_CMD and the bank address BANK_ADDR<0:7>, the bank operation mode signal generating block 100 provides a supply voltage VDD to nodes through which the bank operation mode signals ACT_PCG_CONT<0>-ACT_PCG_CONT<7> are outputted, thereby enabling the bank operation mode signals ACT_PCG_CONT<0>-ACT_PCG_CONT<7> to a logic high level.

Likewise, in response to the precharge command PCG_CMD and the bank address BANK_ADDR<0:7>, the bank operation mode signal generating block 100 provides a ground voltage VSS to the nodes through which the bank operation mode signals ACT_PCG_CONT<0>-ACT_PCG_CONT<7> are outputted, thereby disabling the bank operation mode signals ACT_PCG_CONT<0>-ACT_PCG_CONT<7> to a logic low level.

Referring to FIG. 2B, each of the bank control blocks BANK0_CONTROL-BANK7_CONTROL includes a plurality of delay units 200<0>, 200<1>, . . . , and 200<N>. The bank control blocks BANK0_CONTROL-BANK7_CONTROL serially delay the bank operation mode signals ACT_PCG_CONT<0>-ACT_PCG_CONT<7> predetermined times, and output the plurality of bank operation control signals BANK0_CONT<0:N>-BANK7_CONT<0:N>, respectively. The delay units 200<0>, 200<1>, . . . , and 200<N> properly adjust logic levels of the plurality of bank operation control signals BANK0_CONT<0:N>-

BANK7_CONT<0:N> by changing a decoding method according to whether the plurality of bank operation mode signals ACT_PCG_CONT<0>-ACT_PCG_CONT<7> are enabled or disabled.

When the plurality of bank operation mode signals ACT_PCG_CONT<0>-ACT_PCG_CONT<7> are enabled to a logic high level, the plurality of banks BANK0-BANK7 should perform the active operation. Accordingly, the delay units 200<0>, 200<1>, ..., and 200<N> changes the logic levels of the plurality of bank operation control signals BANK0_CONT<0:N>-BANK7_CONT<0:N> to levels wherein the active operation is performed in the plurality of banks BANK0-BANK7.

Likewise, when the plurality of bank operation mode signals ACT_PCG_CONT<0>-ACT_PCG_CONT<7> are disabled to a logic low level, the plurality of banks BANK0-BANK7 should perform the precharge operation. Accordingly, the delay units 200<0>, 200<1>, ..., and 200<N> changes the logic levels of the plurality of bank operation control signals BANK0_CONT<0:N>-BANK7_CONT<0:N> to levels wherein the precharge operations performed in the plurality of banks BANK0-BANK7.

As described above, in the circuit for controlling the conventional semiconductor memory device, the bank operation mode signal generating block 100 generates the plurality of bank operation mode signals ACT_PCG_CONT<0>-ACT_PCG_CONT<7> in response to the active command ACT_CMD, the precharge command PCG_CMD and the bank address BANK_ADDR<0:7>, the plurality of bank control blocks BANK0_CONTROL-BANK7_CONTROL generate the plurality of bank operation control signals BANK0_CONT<0:N>-BANK7_CONT<0:N> in response to the plurality of bank operation mode signals ACT_PCG_CONT<0>-ACT_PCG_CONT<7>, so that the active operation and the precharge operation are performed in the plurality of banks BANK0-BANK7.

At this time, the bank operation mode signals ACT_PCG_CONT<0>-ACT_PCG_CONT<7> are just enabled in response to the enabled active command ACT_CMD and disabled in response to the enabled precharge command PCG_CMD. Therefore, although the bank operation mode signals ACT_PCG_CONT<0>-ACT_PCG_CONT<7> are enabled or disabled, the active operation and the precharge operation are not automatically performed in the plurality of banks BANK0-BANK7.

That is, the bank operation control signals BANK0_CONT<0:N>-BANK7_CONT<0:N> are used to perform the active operation and the precharge operation in the banks BANK0-BANK7. Since they are generated in the bank control blocks BANK0_CONTROL-BANK7_CONTROL, respectively, various circuits for making the active operation and the precharge operation performed at exact timing in the banks BANK0-BANK7 should be included in each of the bank control blocks BANK0_CONTROL-BANK7_CONTROL. Herein, the various circuits make various operations, such as an operation for disabling a bit line equalizing signal BLEQ, an operation for activating a word line, an operation for activating a bit line sense amplifier (BLSA) and so on, performed sequentially at exact timing, Therefore, each of the bank control blocks BANK0_CONTROL-BANK7_CONTROL has to include the plurality of delay units 200<0>, 200<1>, ..., and 200<N> for defining the timing of the above various operations included in the active operation and the precharge operation as illustrated in FIG. 2B.

However, the plurality of delay units 200<0>, 200<1>, ..., and 200<N> included in each of the bank control blocks BANK0_CONTROL-BANK7_CONTROL occupy a relatively large area compared to a general logic circuit. Therefore, when the semiconductor memory device includes a lot of delay units, it is difficult to reduce a whole size of the semiconductor memory device.

In a memory structure such as the above described conventional semiconductor memory device including the plurality of delay units 200<0>, 200<1>, ..., and 200<N> in each of the plurality of bank control blocks BANK0_CONTROL-BANK7_CONTROL, the whole size of the semiconductor memory device may be increased according to the number of banks included in the semiconductor memory device. Although the number of banks included in the semiconductor memory device is small, the plurality of delay units may always occupy a certain area of the semiconductor memory device and thus it is difficult to reduce the whole size of the semiconductor memory device.

Further, since the bank operation control signals BANK0_CONT<0:N>-BANK7_CONT<0:N> are generated through different delay units for the banks BANK0-BANK7, the banks BANK0-BANK7 may have minute differences in the timing where the active operation and the precharge operation are performed by banks.

SUMMARY OF THE INVENTION

Embodiments of the present invention are directed to a semiconductor memory device including one control circuit capable of controlling the operational timing of a plurality of banks included in the semiconductor memory device.

In accordance with an aspect of the present invention, there is provided a semiconductor memory device including: a plurality of banks, each configured to receive a bank operation control signal and perform predetermined operations in response to the received bank operation control signal; a plurality of bank control blocks, each configured to receive a bank sequential signal and generate the plurality of bank operation control signals in response to enable periods of the received bank sequential signal; and a bank sequential signal generating block configured to generate the plurality of bank sequential signals each having a multiplicity of enable periods that are sequential in response to a command signal.

In accordance with another aspect of the present invention, there is provided a semiconductor memory device including: a plurality of banks, each configured to receive a back operation control signal and perform predetermined operations in response to the received bank operation control signal; a plurality of bank control blocks, each configured to receive a back sequential signal and generate the plurality of bank operation control signals in response to enable periods of the received bank sequential signal; an active sequential signal generating block configured to generate a plurality of active sequential signals corresponding to the plurality of bank control blocks, wherein each of the plurality of active sequential signals has a multiplicity of enable periods that are sequential in response to an active command signal; a precharge sequential signal generating block configured to generate a plurality of precharge sequential signals corresponding to the plurality of bank control blocks, wherein each of the plurality of precharge sequential signals has a multiplicity of enable periods that are sequential in response to a precharge command signal; and a bank sequential signal transferring block configured to serialize the plurality of active sequential signals and the plurality of precharge sequential signals and to transfer the serialized signals as the plurality of bank sequential signals to the plurality of bank control blocks.

DESCRIPTION OF SPECIFIC EMBODIMENTS

Other objects and advantages of the present invention can be understood by the following description, and become apparent with reference to the embodiments of the present invention.

Figure 1:
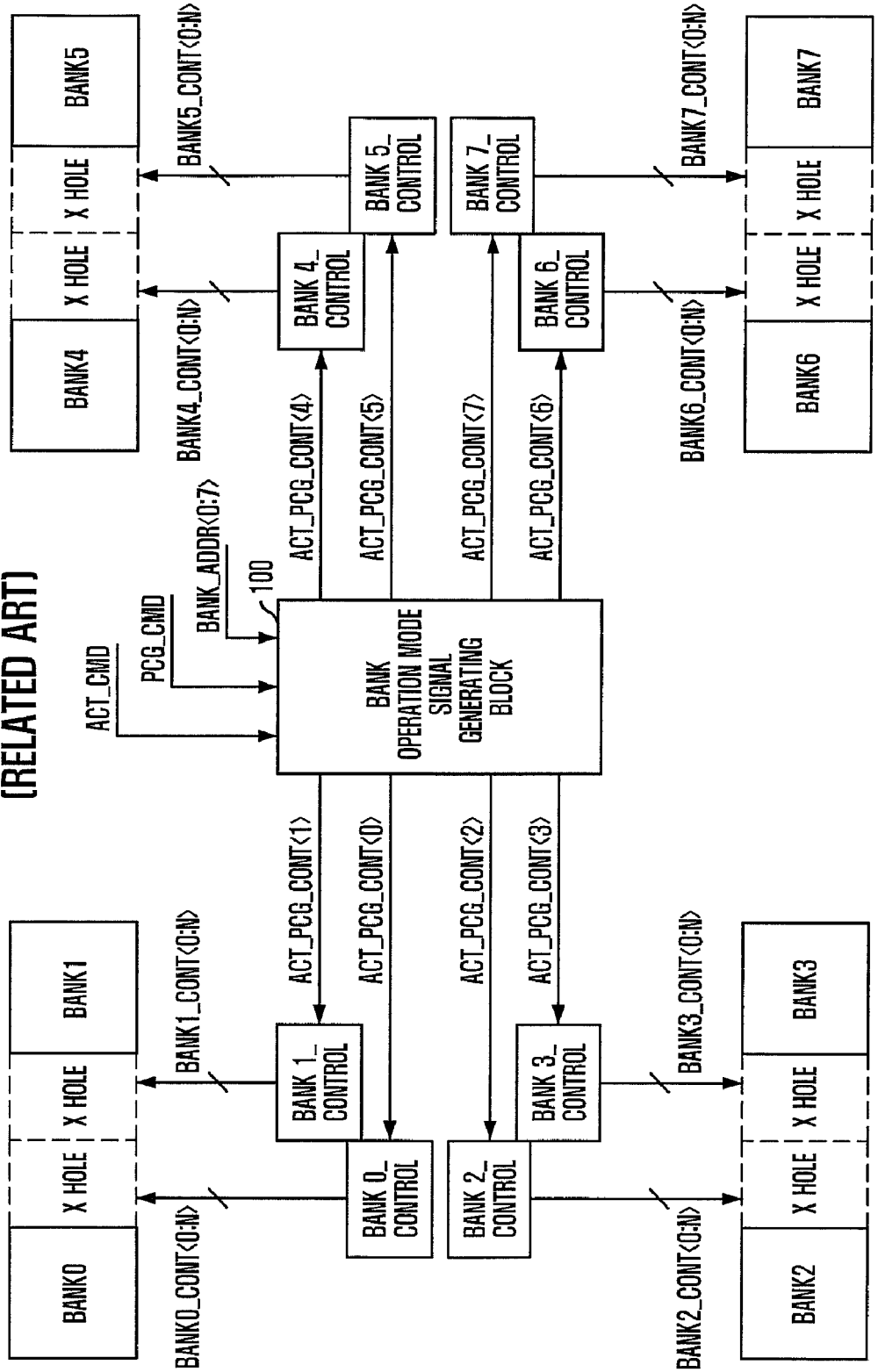
FIG. 1 illustrates a block diagram of a conventional semiconductor memory device including a plurality of banks.
Figure 2A:
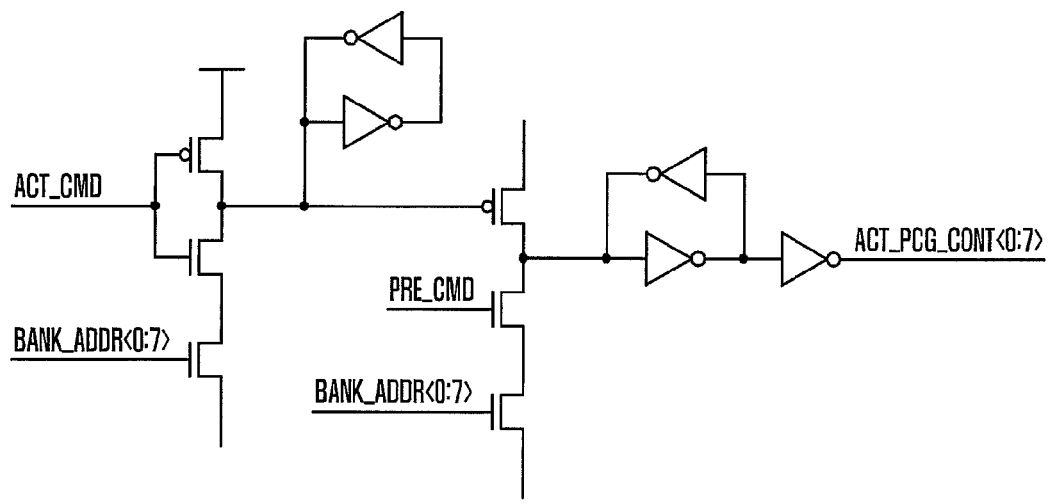
FIGS. 2A and 2B illustrate detailed circuit diagrams of a bank operation mode signal generating block and a plurality of bank control blocks described in FIG. 1, respectively.
Figure 2B:
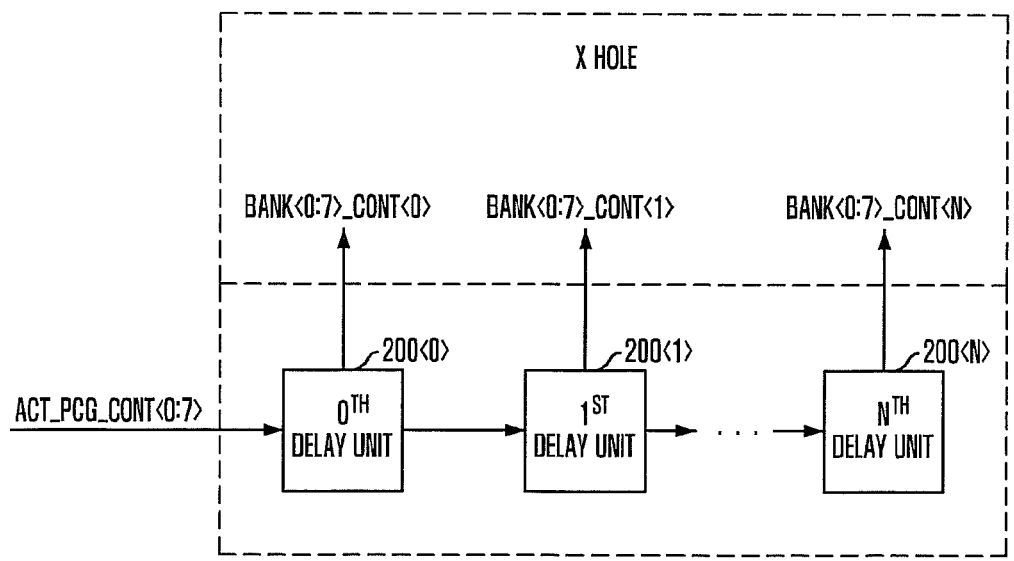
Figure 3:
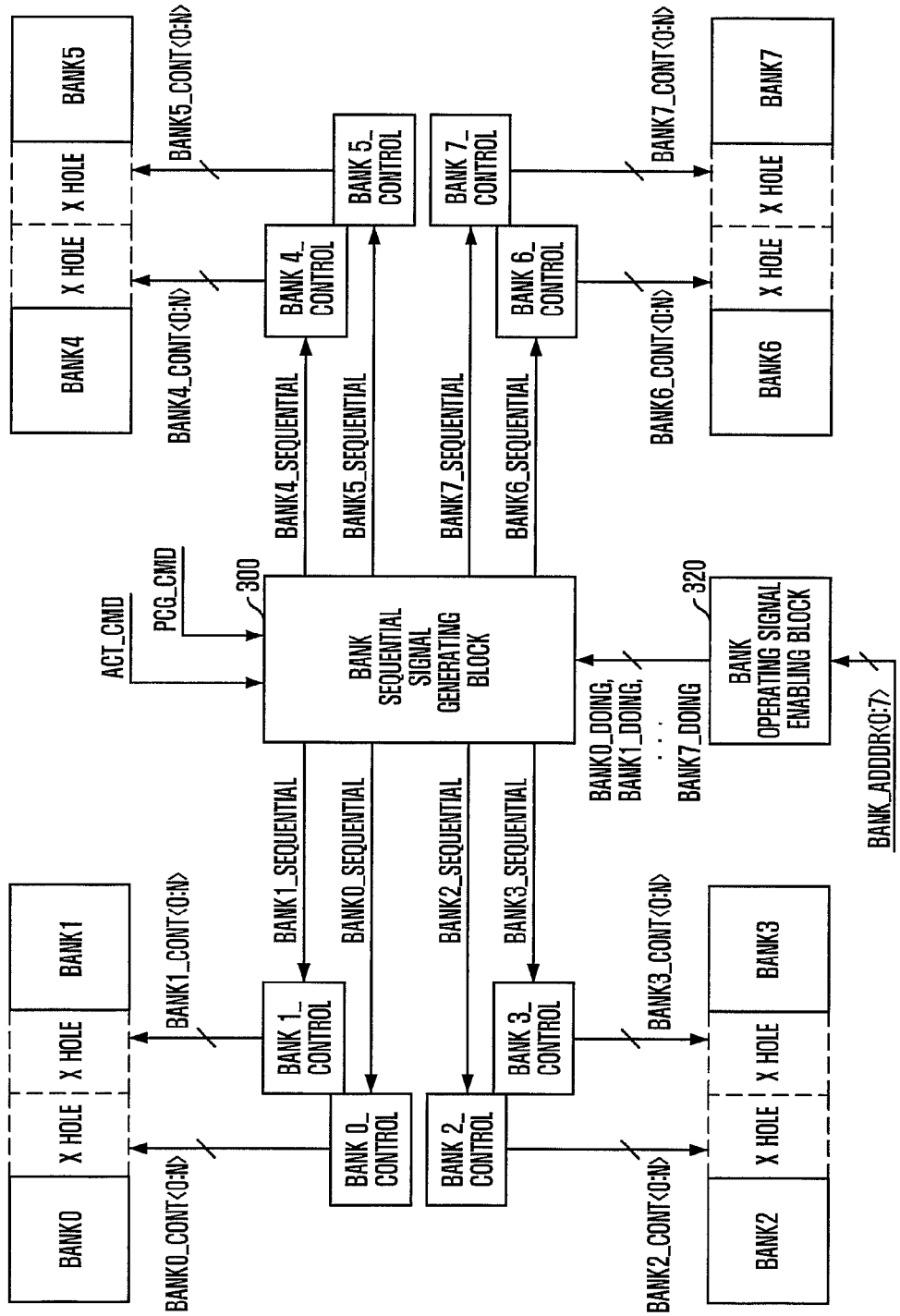
FIG. 3 illustrates a block diagram of a semiconductor memory device including a plurality of banks in accordance with an embodiment of the present invention.

FIG. 3 illustrates a block diagram of a semiconductor memory device including a plurality of banks in accordance with an embodiment of the present invention.

As shown, the semiconductor memory device includes a plurality of banks BANK0-BANK7, a plurality of bank control blocks BANK0_CONTROL-BANK7_CONTROL, and a bank sequential signal generating block 300.

The plurality of banks BANK0-BANK7 each performs various operations in response to a corresponding one of a plurality of bank operation control signals BANK0_CONT<0:N>-BANK7_CONT<0:N>. The plurality of bank control blocks BANK0_CONTROL-BANK7_CONTROL configured to generate the plurality of bank operation control signals BANK0_CONT<0:N>-BANK7_CONT<0:N> in response to enable periods of a plurality of bank sequential signals BANK0_SEQUENTIAL-BANK7_SEQUENTIAL, respectively. The bank sequential signal generating block 300 configured to generate the plurality of bank sequential signals BANK0_SEQUENTIAL-BANK7_SEQUENTIAL transferred to the plurality of bank control blocks BANK0_CONTROL-BANK7_CONTROL, wherein each of the plurality of bank sequential signals BANK0_SEQUENTIAL-BANK7_SEQUENTIAL is generated to have a plurality of enable periods that are sequential in response to command signals ACT_CMD and PCG_CMD.

The semiconductor memory further includes a bank operating signal enabling block 320 configured to selectively enable a plurality of bank operating signals BANK0_DOING-BANK7_DOING for operating the plurality of banks BANK0-BANK7 in response to a bank address BANK_ADDR<0:7>, wherein the successively selected bank operating signals BANK0_DOING-BANK7_DOING are enabled to have a time interval longer than a scheduled time. For the reference, in case of a double data rate 3 synchronous dynamic random access memory (DDR3 SDRAM) device, the scheduled time is 4 clock periods 4tck.

Figure 4:
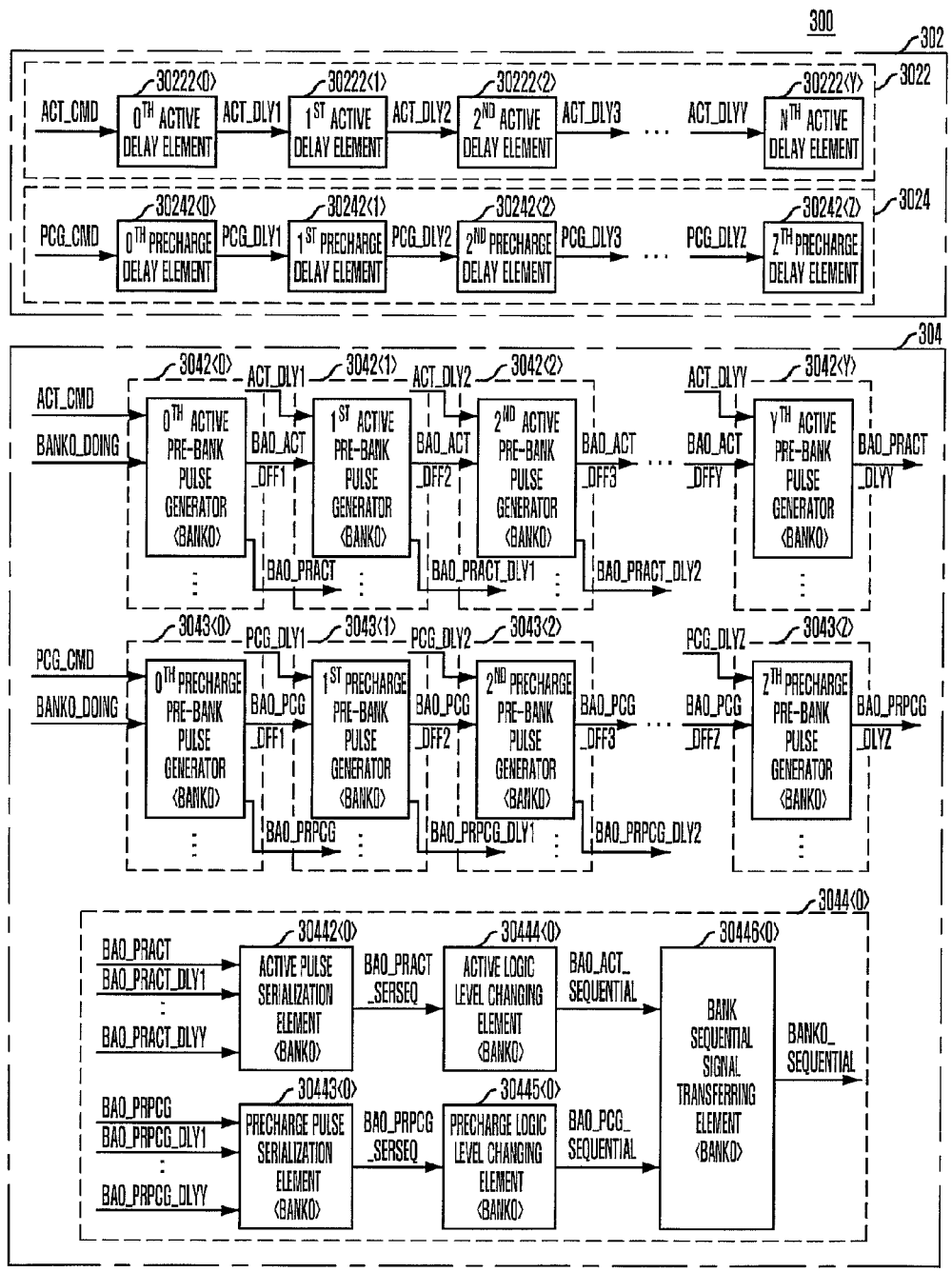
FIG. 4 illustrates a block diagram of a bank sequential signal generating block for controlling the operation of the semiconductor memory device described in FIG. 3.

FIG. 4 illustrates a detailed block diagram of the bank sequential signal generating block 300 for controlling the operation of the semiconductor memory device described in FIG. 3.

As shown, the bank sequential signal generating block 300 includes a delayed command signal generating unit 302, and a bank sequential signal enable period determining unit 304.

The delayed command signal generating unit 302 generates a plurality of delayed command signals ACT_DLY1, ACT_DLY2, ACT_DLY3, . . . , ACT_DLYY, PCG_DLY1, PCG_DLY2, PCG_DLY3, . . . , and PCG_DLYZ by serially delaying the command signals ACT_CMD and PCG_CMD predetermined times. The bank sequential signal enable period determining unit 304 makes each of the plurality of bank sequential signals BANK0_SEQUENTIAL-BANK7_SEQUENTIAL have a plurality of sequential enable periods in response to the activation of the command signals ACT_CMD and PCG_CMD and the plurality of delayed command signals ACT_DLY1-ACT_DLYY and PCG_DLY1-PCG_DLYZ.

The delayed command signal generating unit 302 serially delays the command signals ACT_CMD and PCG_CMD using predetermined numbers of delay elements 30222<0>-30222<Y> and 30242<0>-30242<Z> that are connected to have a chain structure, and outputs the plurality of delayed command signals ACT_DLY1-ACT_DLYY and PCG_DLY1-PCG_DLYZ through the delay elements 30222<0>-30222<Y> and 30242<0>-30242<Z>, respectively.

The delayed command signal generating unit 302 includes a delayed active command signal generator 3022 and a delayed precharge command signal generator 3024.

The delayed active command signal generator 3022 generates the plurality of delayed active command signals ACT_DLY1-ACT_DLYY by serially delaying the active command signal ACT_CMD the predetermined times. The delayed precharge command signal generator 3024 generates the plurality of delayed precharge command signals PCG_DLY1-PCG_DLYZ by serially delaying the precharge command signal PCG_CMD the predetermined times. Therefore, the delayed active command signal generator 3022 serially delays the active command signal ACT_CMD using the predetermined numbers of delay elements 30222<0>-30222<Y> that are connected to have a chain structure, and outputs the plurality of delayed active command signals ACT_ DLY1-ACT_DLYY through the delay elements 30222<0>-and 30222<Y>, respectively. The delayed precharge command signal generator 3024 serially delays the precharge command signal PCG_CMD using the predetermined numbers of delay elements 30242<0>-30242<Z> that are connected to have a chain structure, and outputs the plurality of delayed precharge command signals PCG_DLY1-PCG_DLYZ through the delay elements 30242<0>-30242<Z>, respectively.

The bank sequential signal enable period determining unit 304 includes a plurality of pre-bank pulse generators 3042<0>-3042<Y> and 3043<0>-3043<Z> and a signal merger 3044<0>, which is for the bank BANK0. Corresponding elements for other banks is omitted for the sake of convenience.

The pre-bank pulse generators are classified into a plurality of active pre-bank pulse generators 3042<0>-3042<Y>, and a plurality of precharge pre-bank pulse generators 3043<0>-3043<Z>. The plurality of active pre-bank pulse generators 3042<0>-3042<Y> generate a multiplicity of active pre-bank pulses BA0_PRACT-BA0_PRACT_DLYY in response to the active command signal ACT_CMD and the plurality of delayed active command signals ACT_DLY1-ACT_DLYY when corresponding one of the plurality of bank operating signals BANK0_DOING-BANK7_DOING, i.e., BANK0_DOING, is enabled. The plurality of precharge pre-bank pulse generators 3043<0>-3043<Z> generate a multiplicity of precharge pre-bank pulses BA0_PRPCG-BA0_PRPCG_DLYZ in response to the precharge command signal PCT_CMD and the plurality of delayed precharge command signals PCG_DLY1-PCG_DLYZ when the bank operating signal BANK0_DOING is enabled.

The signal merger 3044<0> outputs a bank sequential signal BANK0_SEQUENTIAL by merging a multiplicity of pre-bank pulses, including the active and precharge pre-bank pulses BA0_PRACT-BA0_PRACT_DLYY and BA0_PRPCG-BA0_PRPCG_DLYZ, outputted from the plurality of pre-bank pulse generators 3042<0>-3042<Y> and 3043<0>-3043<Z>.

The signal merger 3044<0> include pulse serialization elements 30442<0> and 30443<0> that serialize the multiplicity of pre-bank pulses BA0_PRACT-BA0_PRACT_DLYY and BA0_PRPCG-BA0_PRPCG_DLYZ generated from the plurality of pre-bank pulse generators 3042<0>-3042<Y> and 3043<0>-3043<Z> to output pre-bank sequential signals BA0_PRACT_SERSEQ and BA0_PRPCG_SERSEQ, and logic level changing elements 30444<0> and, 30445<0>, that change logic levels of the bank sequential signal BANK0_SEQUENTIAL whenever the pre-bank sequential signals BA0_PRACT_SERSEQ and BA0_PRPCG_SERSEQ are enabled.

The pulse serialization elements are classified into an active pulse serialization element 30442<0> a precharge pulse serialization element 30443<0>. The active pulse serialization element 30442<0> serializes the multiplicity of active pre-bank pulses BA0_PRACT-BA0_PRACT_DLYY generated from the active pre-bank pulse generators 3042<0>-3042<Y> to output an active pre-bank sequential signal BA0_PRACT_SERSEQ. The precharge pulse serialization element 30443<0> serializes the multiplicity of pre-charge pre-bank pulses BA0_PRPCG-BA0_PRPCG_DLYZ generated from the precharge pre-bank pulse generators 3043<0>-3043<Z> to output a plurality of precharge pre-bank sequential signal BA0_PRPCG_SERSEQ.

The logic level changing elements are classified into an active logic level changing element 30444<0> and a precharge logic level changing element 30445<0>. The active logic level changing element 30444<0> change logic levels of an active sequential signal BANK0_ACT_SEQUENTIAL whenever the active pre-bank sequential signal BA0_PRACT_SERSEQ is enabled. The precharge logic level changing element 30445<0> change logic levels of a precharge sequential signal BANK0_PCG_SEQUENTIAL whenever the precharge pre-bank sequential signal BA0_PRPCG_SERSEQ is enabled.

Furthermore, a bank sequential signal transferring element 30446<0> may be included to serialize the active sequential signal BANK0_ACT_SEQUENTIAL and the precharge sequential signals BANK0_PCG_SEQUENTIAL, and transfer the serialized signals to the bank control blocks BANK0_CONTROL as the bank sequential signal BANK0_SEQUENTIAL.

Figure 5:
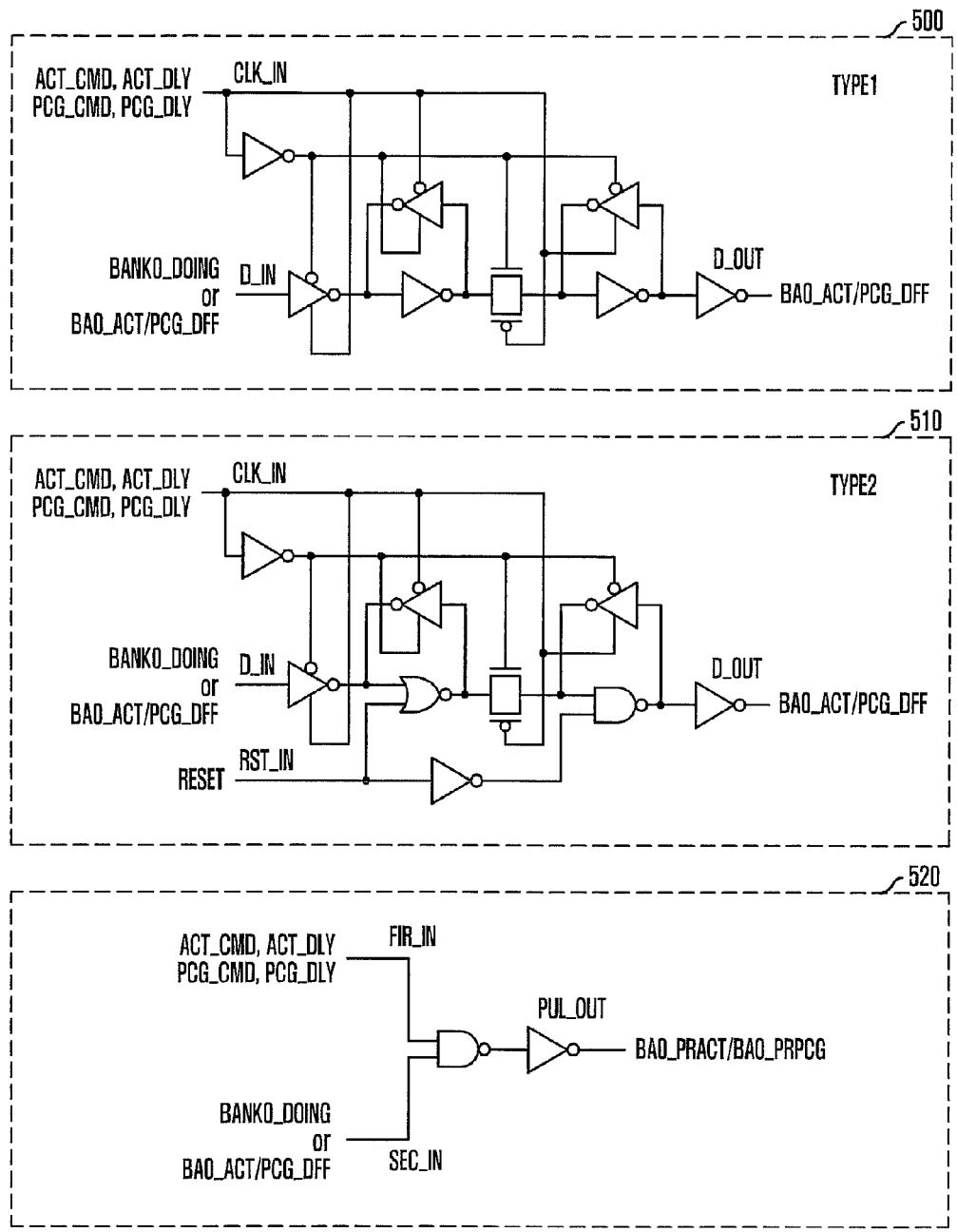
FIG. 5 illustrates a detailed circuit diagram of a pre-bank pulse generator included in the bank sequential signal generating block described in FIG. 4.

FIG. 5 illustrates a detailed circuit diagram of the pre-bank pulse generator included in the bank sequential signal generating block 300 described in FIG. 4.

As shown, since the plurality of pre-bank pulse generators 3042<0>-3042<Y> and 3043<0>-3043<Z> are identical in the configuration, one of them is illustrated in FIG. 5. The pre-bank pulse generator includes a bank operation period signal generating element 500/510 and a pre-bank pulse outputting element 520.

The bank operation period signal generating element 500-510 generate a bank operation period signal BA0_ACT/PCG_DFF, that is enabled whenever corresponding one among the command signals ACT_CMD and PCG_CMD and the delayed command signals ACT_DLY and PCG_DLY is enabled, in response to the bank operating signal BANK0_DOING or a bank operation period signal BA0_ACT/PCG_DFF outputted from the previous pre-bank pulse generator.

The pre-bank pulse outputting element 520 outputs the pre-bank pulse BA0_PRACT or BA0_PRPCG in response to corresponding one of the command signals ACT_CMD and PCG_CMD and the delayed command signals ACT_DLY and PCG_DLY in enable period of the bank operating signal BANK0_DOING or the bank operation period signal BA0_ACT/PCG_DFF outputted from the previous pre-bank pulse generator Herein, it is noted that the bank operation period signal generating element 500/510 is constructed in 2 types. The 2 types have different connecting structures between logic circuits included therein but both of them perform a D flip-flop operation. That is, the bank operation period signal BA0_ACT/PCG_DFF are outputted through a data output terminal D_OUT in response to the bank operating signal BANK0_DOING or the previous bank operation period signal BA0_ACT/PCG_DFF whenever the corresponding command signal inputted through a plurality of clock input terminals CLK_IN are enabled. The difference between the first type and the second type is that, in the second type, the operation may be initialized in response to a signal RESET inputted through a reset input terminal RST_IN.

The pre-bank pulse outputting element 520 includes a NAND gate and an inverter that receive the bank operating signal BANK0_DOING or the previous bank operation period signal BA0_ACT/PCG_DFF through a second input terminal SEC_IN and corresponding one of the command signals ACT_CMD and PCG_CMD and the delayed command signals ACT_DLY and PCG_DLY through a first input terminal FIR_IN, logically combine the received signals and output the pre-bank pulse BA0_ACT/PCG_DFF through a pulse output terminal PUL_OUT.

Figure 6:
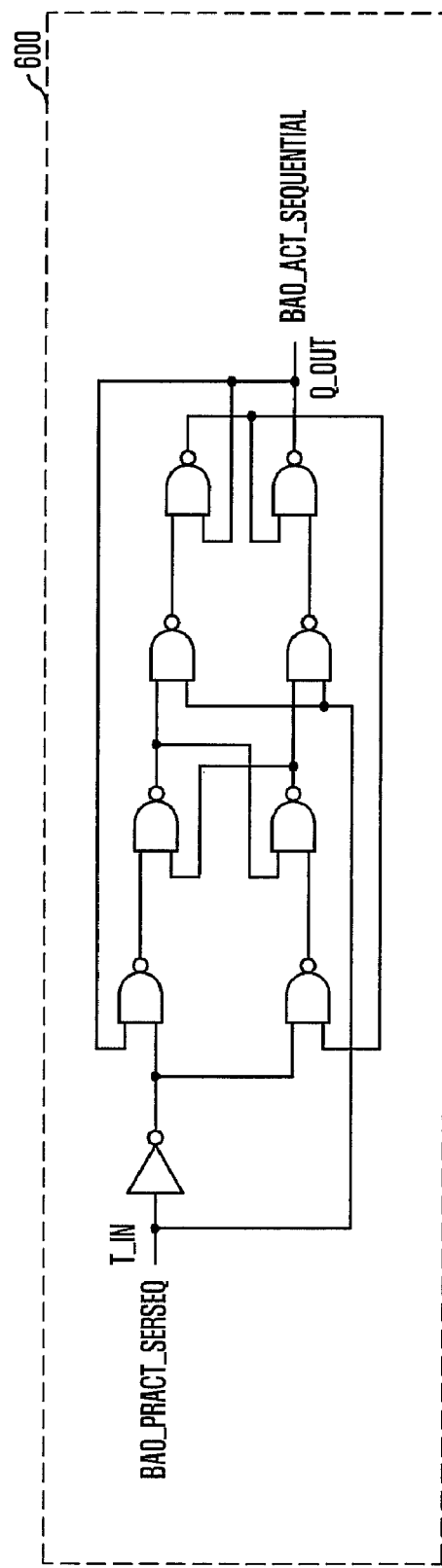
FIG. 6 illustrates a detailed circuit diagram of a logic level changing element included in the bank sequential signal generating block described in FIG. 4.

FIG. 6 illustrates a detailed circuit diagram of the logic level changing element included in the bank sequential signal generating block 300 described in FIG. 4.

The logic level changing element 600 described in FIG. 6 is applied to the active logic level changing element 30444<0> and the precharge logic level changing element 30445<0> included in the signal merger 3044<0>.

In particular, considering an operation of the logic level changing element 600 described in FIG. 6, it is noted that the circuit is a T flip-flop. That is, if the active sequential signal BANK0_ACT_SEQUENTIAL or the precharge sequential signal BANK0_PCG_SEQUENTIAL is in a disabled state, the logic level changing element 600 performs an operation of changing the disabled state to an enabled state when the active pre-bank sequential signal BA0_PRACT_SERSEQor the precharge pre-bank sequential signal is enabled through a data input terminal T_IN. On the other hand, if the active sequential signal BANK0_ACT_SEQUENTIAL or the precharge sequential signal BANK0_PCG_SEQUENTIAL is in an enabled state, the logic level changing element 600 performs an operation of changing the enabled state to a disabled state.

Figure 7:
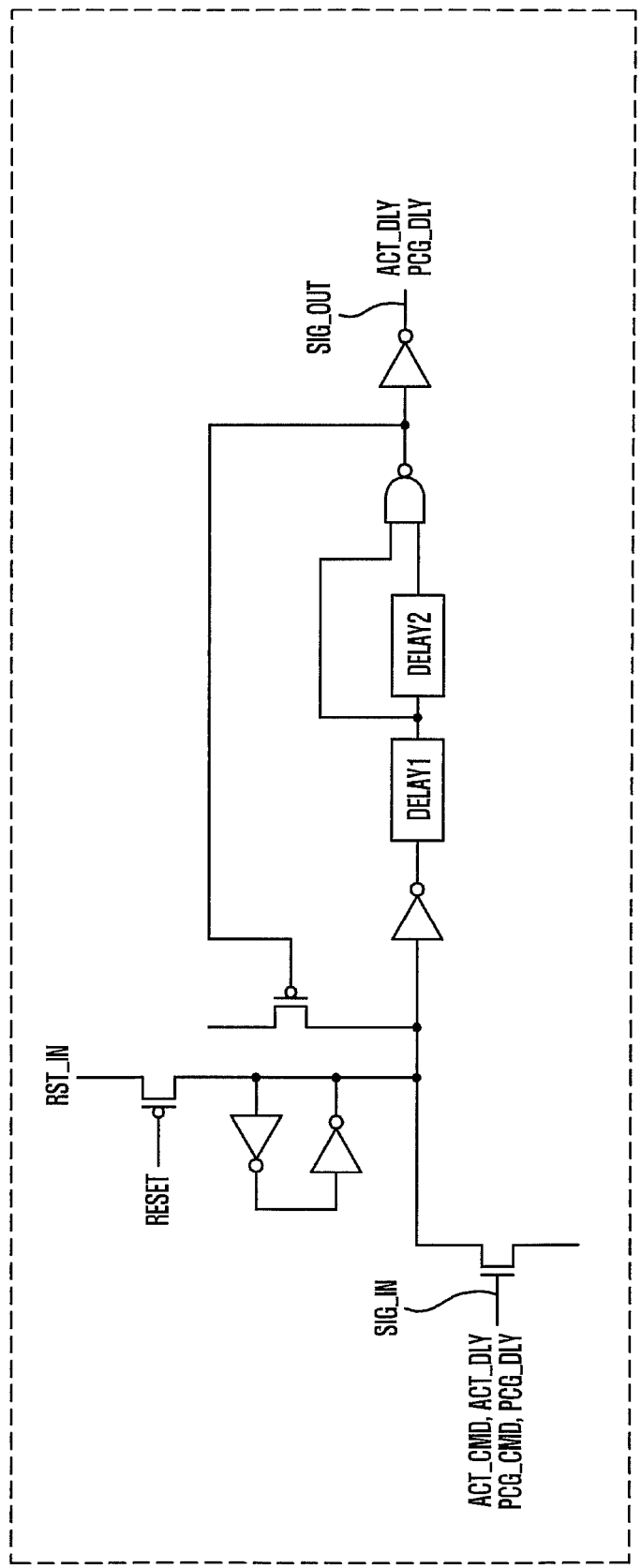
FIG. 7 illustrates a detailed circuit diagram of a delay element included in a delayed command signal generating unit described in FIG. 4.

FIG. 7 illustrates a detailed circuit diagram of a delay element includes in the delayed command signal generating unit 302 described in FIG. 4.

In particular, the command signal ACT_CMD/PCG_CMD or the delayed command signal ACT_DLY/PCG_DLY outputted from the previous delay element is inputted though a signal input terminal SIG_IN. And, in response to the activation of the signal inputted through the signal input terminal SIG_IN, the delayed command signal ACT_DLY/PCG_DLY to be transferred to the next delay element is enabled and outputted through a signal output terminal SIG_OUT after a time corresponding to a delay amount obtained by adding a delay amount of a first delay DELAY1 and a delay amount of a second delay DELAY2 passes.

Under this condition, if the signal inputted through the signal input terminal SIG_IN to the delay element is disabled, the delayed command signal ACT_DLY/PCG_DLY outputted through the signal output terminal SIG_OUT is disabled after a time corresponding to the delay amount of the first delay DELAY1 passes.

Namely, the time corresponding to two delays DELAY1 and DELAY2 is required when the delayed command signal ACT_DLY/PCG_DLY is enabled in response to the activation of the corresponding command signal. On the other hand, only the time corresponding to one delay DELAY1 is required when the delayed command signal ACT_DLY/PCG_DLY is disabled in response to the inactivation of the corresponding command signal.

Accordingly, by adjusting the delay amount of the first delay DELAY1, it is possible to adjust a pulse width of the delayed command signals ACT_DLY/PCG_DLY outputted through the signal output terminal SIG_OUT. By adjusting the delay amount of the second delay DELAY2, it is possible to adjust points of time where the previous delayed command signal ACT_DLY/PCG_DLY is enabled from points of time where the next delayed command signal ACT_DLY/PCG_DLY is enabled.

Figure 8:
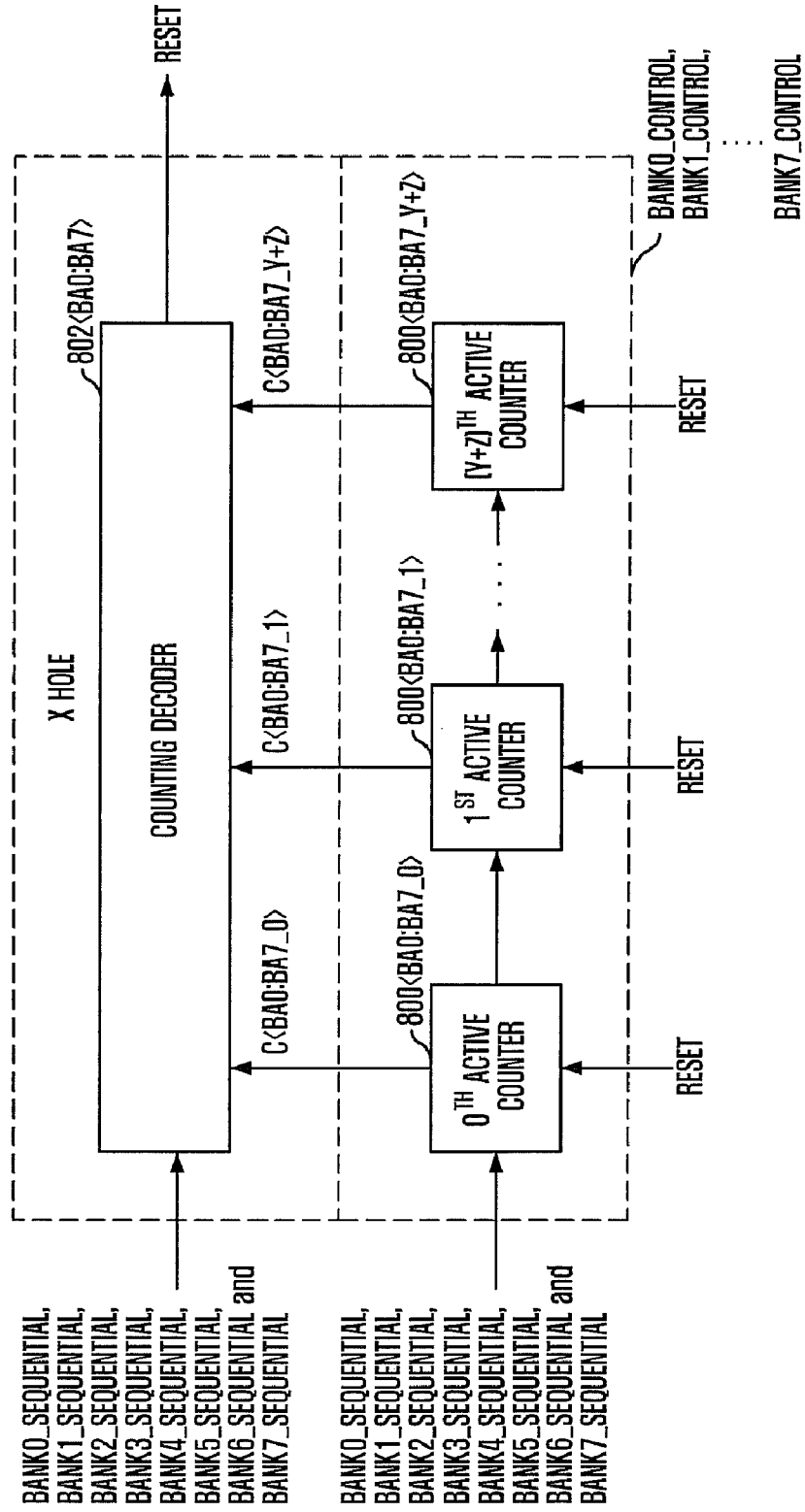
FIG. 8 illustrates a block diagram of a plurality of bank control blocks for controlling the operation of the semiconductor memory device described in FIG. 3.

FIG. 8 illustrates a block diagram of the plurality of bank control blocks for controlling the operation of the semiconductor memory device described in FIG. 3.

As shown, the plurality of bank control blocks BANK0_CONTROL, BANK1_CONTROL, BANK2_CONTROL, BANK3_CONTROL, BANK4_CONTROL, BANK5_CONTROL, BANK6_CONTROL and BANK7_CONTROL includes a plurality of enable counters 800<BA0_0>, 800<BA0_1>, . . . , 800<BA0_Y+Z>, 800<BA1_0>, 800<BA1_1>, . . . , 800<BA1_Y+Z>, . . . , 800<BA7_0>, 800<BA7_1>, . . . , and 800<BA7_Y+Z> for counting enable periods of the plurality of bank sequential signals BANK0_SEQUENTIAL, BANK1_SEQUENTIAL, BANK2_SEQUENTIAL, BANK3_SEQUENTIAL, BANK4_SEQUENTIAL, BANK5_SEQUENTIAL, BANK6_SEQUENTIAL and BANK7_SEQUENTIAL, respectively, and a plurality of counting decoders 802<BA0>, 802<BA1>, 802<BA2>, 802<BA3>, 802<BA4>, 802<BA5>, 802<BA6> and 802<BA7> for decoding output signals C<BA0_0>, C<BA0_1>, C<BA0_Y+Z>, C<BA1_0>, C<BA1_1>, . . . , C<BA1_Y+Z>, . . . , and C<BA7_0>, C<BA7_1>, . . . , and C<BA7_Y+Z> of the plurality of enable counters 800<BA0_0>, 800<BA0_1>, . . . , 800<BA0_Y+Z>, 800<BA1_0>, 800<BA1_1>, . . . , 800<BA1_Y+Z>, . . . , 800<BA7_0>, 800<BA7_1>, . . . , and 800<BA7_Y+Z> to change values of the plurality of bank operating signals BANK0_DOING, BANK1_DOING, BANK2_DOING, BANK3_DOING, BANK4_DOING, BANK5_DOING, BANK6_DOING and BANK7_DOING.

Herein, the plurality of enable counters 800<BA0_0>, 800<BA0_1>, . . . , 800<BA0_Y+Z>, 800<BA1_0>, 800<BA1_1>, . . . , 800<BA1_Y+Z>, . . . , 800<BA7_0>, 800<BA7_1>, . . . , and 800<BA7_Y+Z> count how many enable periods each of the plurality of bank sequential signals BANK0_SEQUENTIAL, BANK1_SEQUENTIAL, BANK2_SEQUENTIAL, BANK3_SEQUENTIAL, BANK4_SEQUENTIAL, BANK5_SEQUENTIAL, BANK6_SEQUENTIAL and BANK7_SEQUENTIAL has.

The plurality of counting decoders 802<BA0>, 802<BA1>, 802<BA2>, 802<BA3>, 802<BA4>, 802<BA5>, 802<BA6> and 802<BA7> properly adjust the values of the plurality of bank operating signals BANK0_DOING, BANK1_DOING, BANK2_DOING, BANK3_DOING, BANK4_DOING, BANK5_DOING, BANK6_DOING and BANK7_DOING according to a starting point and the number of enable periods counted at the plurality of enable counters 800<BA0_0>, 800<BA0_1>, . . . , 800<BA0_Y+Z>, 800<BA1_0>, 800<BA1_1>, . . . , 800<BA1_Y+Z>, . . . , 800<BA7_0>, 800<BA7_1>, . . . , and 800<BA7_Y+Z>, and, as a result, predetermined various operations can be sequentially performed in the plurality of banks BANK0, BANK1, BANK2, BANK3, BANK4, BANK5, BANK6 and BANK7.

Figure 9:
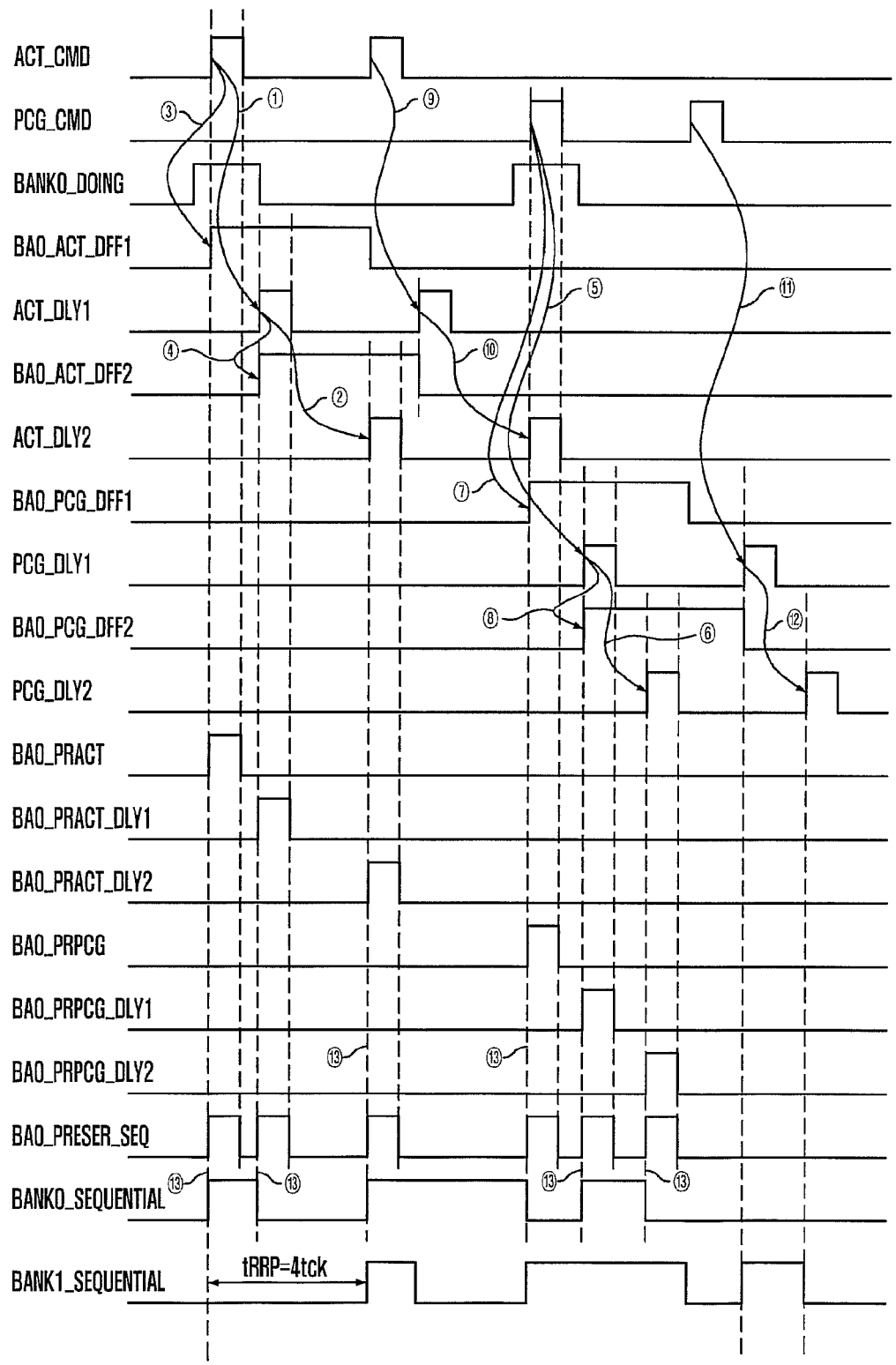
FIG. 9 illustrates a timing diagram showing the operation of the semiconductor memory device described in FIG. 3.

FIG. 9 illustrates a timing diagram showing the operation of the semiconductor memory device described in FIG. 3.

As shown, in the semiconductor memory device, if the command signals ACT_CMD and PCG_CMD are enabled, the plurality of delayed command signals ACT_DLY1, ACT_DLY2, ACT_DLY3, . . . , ACCT_DLYY, PCG_DLY1, PCG_DLY2, PCG_DLY3, . . . , and PCG_DLYZ are enabled, referring to ①, ②, ⑤, ⑥, ⑨, ⑩, ⑪, ⑫ in FIG. 9. For every point of time ⑬ where the command signals ACT_CMD and PCG_CMD and the plurality of delayed command signals ACT_DLY1, ACT_DLY2, ACT_DLY3, . . . , ACCT_DLYY, PCG_DLY1, PCG_DLY2, PCG_DLY3 . . . , and PCG_DLYZ are enabled, the logic levels of the plurality of bank sequential signals BANK0_SEQUENTIAL, BANK1_SEQUENTIAL, BANK2_SEQUENTIAL, BANK3_SEQUENTIAL, BANK4_SEQUENTIAL, BANK5_SEQUENTIAL, BANK6_SEQUENTIAL and BANK7_SEQUENTIAL are changed. Thus, the plurality of bank sequential signals BANK0_SEQUENTIAL, BANK1_SEQUENTIAL, BANK2_SEQUENTIAL, BANK3_SEQUENTIAL, BANK4_SEQUENTIAL, BANK5_SEQUENTIAL, BANK6_SEQUENTIAL and BANK7_SEQUENTIAL are generated to have a plurality of enable periods that are sequential.

Moreover, it is noted that, whenever each of the bank operating signals BANK0_DOING, BANK1_DOING, BANK2_DOING, BANK3_DOING, BANK4_DOING, BANK5_DOING, BANK6_DOING and BANK7_DOING has an enable period, the command signals ACT_CMD and PCG_CMD are enabled for a predetermined time. This represents that, since the command signals ACT_CMD and PCG_CMD should be enabled so as to make the plurality of banks BANK0, BANK1, BANK2, BANK3, BANK4, BANK5, BANK6 and BANK7 perform predetermined operations in response to the activation of any one of the bank operating signals BANK0_DOING, BANK1_DOING, BANK2_DOING, BANK3_DOING, BANK4_DOING, BANK5_DOING, BANK6_DOING and BANK7_DOING, the timings of the activation are artificially controlled to be consistent with each other.

Accordingly, when any one of the bank operating signals BANK0_DOING, BANK1_DOING, BANK2_DOING, BANK3_DOING, BANK4_DOING, BANK5_DOING, BANK6_DOING and BANK7_DOING is selected and enabled, any one of the bank sequential signals BANK0_SEQUENTIAL, BANK1_SEQUENTIAL, BANK2_SEQUENTIAL, BANK3_SEQUENTIAL, BANK4_SEQUENTIAL, BANK5_SEQUENTIAL, BANK6_SEQUENTIAL and BANK7_SEQUENTIAL corresponding to the selected bank operating signal becomes to have a plurality of enable periods that are sequential in response to the command signals ACT_CMD and PCG_CMD.

At this time, the successively selected bank operating signals BANK0_DOING, BANK1_DOING, BANK2_DOING, BANK3_DOING, BANK4_DOING, BANK5_DOING, BANK6_DOING and BANK7_DOING are always enabled to have a time interval longer than a scheduled time. Therefore, the successively selected bank sequential signals BANK0_SEQUENTIAL, BANK1_SEQUENTIAL, BANK2_SEQUENTIAL, BANK3_SEQUENTIAL, BANK4_SEQUENTIAL, BANK5_SEQUENTIAL, BANK6_SEQUENTIAL and BANK7_SEQUENTIAL are also enabled to have a time interval longer than a preset time since the plurality of banks BANK0-BANK7 share global input/output lines used for inputting/outputting data. That is, by allowing each point of time when the plurality of banks BANK0-BANK7 operates to have a predetermined time interval, the occurrence of data collision is prevented in a shared device such as a global input/output line.

In particular, in a first enable period of the $0^{th}$ bank operating signal BANK0_DOING among the bank operating signals BANK0_DOING, BANK1_DOING, BANK2_DOING, BANK3_DOING, BANK4_DOING, BANK5_DOING, BANK6_DOING and BANK7_DOING, the active command signal ACT_CMD is enabled. In response to the enabled active command signal ACT_CMD, the delayed command signal generating unit 302 generates the first and second delayed active command signals ACT_DLY1 and ACT_DLY2 and, at the same time, the bank operation period signal generating elements included in the $0^{th}$ and first active pre-bank pulse generators 3042<0> and 3042<1> generate the first and second active bank operation period signals BAI<0>_ACT_DFF1 and BAI<0>_ACT_DFF2.

Herein, since the enable period of the first active bank operation period signal BAI<0>_ACT_DFF1 is a period from a point of time where the active command signal ACT_CMD is enabled to a point of time where the active command signal ACT_CMD is enabled again, the first delayed active command signal ACT_DLY1 must be enabled in a state where the first active bank operation period signal BAI<0>_ACT_DFF1 is enabled. Likewise, since the enable period of the second active bank operation period signal BAI<0>_ACT_DFF2 is a period from a point of time where the first delayed active command signal ACT_DLY1 is enabled to a point of time where the first delayed active command signal ACT_DLY1 is enabled again, the second delayed active command signal ACT_DLY2 must be enabled in a state where the second active bank operation period signal BAI<0>_ACT_DFF2 is enabled. As a result, at a point of time where the active command signal ACT_CMD and the first and second delayed active command signals ACT_DLY1 and ACT_DLY2 are enabled, each of the $0^{th}$ to the second active pre-bank pulses BA0_PRACT, BA0_PRACT_DLY1 and BA0_PRACT_DLY2 can be enabled.

In a second enable period of the $0^{th}$ bank operating signal BANK0_DOING, the precharge command signal PCG_CMD is enabled. In response to the enabled precharge command signal PCG_CMD, the delayed command signal generating unit 302 generates the first and second delayed precharge command signals PCG_DLY1 and PCG_DLY2 and, at the same time, the bank operation period signal generating elements included in the $0^{th}$ and first precharge pre-bank pulse generators 3043<0> and 3043<1> generate the first and second precharge bank operation period signals BAI<0>_PCG_DFF1 and BAI<0>_PCG_DFF2.

Herein, since the enable period of the first precharge bank operation period signal BAI<0>_PCG_DFF1 is a period from a point of time where the precharge command signal PCG_CMD is enabled to a point of time where the precharge command signal PCG_CMD is enabled again, the first delayed precharge command signal PCG_DLY1 must be enabled in a state where the first precharge bank operation period signal BAI<0>_PCG_DFF1 is enabled. Likewise, since the enable period of the second precharge bank operation period signal BAI<0>_PCG_DFF2 is a period from a point of time where the first delayed precharge command signal PCG_DLY1 is enabled to a point of time where the first delayed precharge command signal PCG_DLY1 is enabled again, the second delayed precharge command signal PCG_DLY2 must be enabled in a state where the second precharge bank active bank operation period signal BAI<0>_PCG_DFF2 is enabled. As a result, at a point of time where the precharge command signal PCG_CMD and the first and second delayed precharge command signals PCG_DLY1 and PCG_DLY2 are enabled, each of the $0^{th}$ to second precharge pre-bank pulses BA0_PRPCG, BA0_PRPCG_DLY1 and BA0_PRPCG_DLY2 can be enabled.

If the $0^{th}$ to second active pre-bank pulses BA0_PRACT, BA0_PRACT_DLY1 and BA0_PRACT_DLY2 and the $0^{th}$ to second precharge pre-bank pulses BA0_PRPCG, BA0_PRPCG_DLY1 and BA0_PRPCG_DLY2 are respectively enabled, the active pulse serialization element 30442<0> and the precharge pulse serialization element 30443<0> included in the signal merger 3044<0> serialize the enabled $0^{th}$ to second active pre-bank pulses BA0_PRACT, BA0_PRACT_DLY1 and BA0_PRACT_DLY2 and the enabled $0^{th}$ to second precharge pre-bank pulses BA0_PRPCG, BA0_PRPCG_DLY1 and BA0_PRPCG_DLY2 and output the active pre-bank sequential signal BA0_PRACT_SERSEQ and the precharge pre-bank sequential signal BA0_PRPCG_SERSEQ, respectively. In response to the active pre-bank sequential signal BA0_PRACT_SERSEQ and the precharge pre-bank sequential signal BA0_PRPCG_SERSEQ, the active logic level changing element 30444<0> and the precharge logic level changing element 30445<0> output the active sequential signal BANK0_ACT_SEQUENTIAL and the precharge sequential signal BANK0_PCG_SEQENTIAL, respectively. The bank sequential signal transferring element 30446<0> transfers the active sequential signal BANK0_ACT_SEQUENTIAL and the precharge sequential signal BANK0_PCG_SEQENTIAL as the $0^{th}$ bank sequential signal BANK0_SEQUENTIAL to the $0^{th}$ bank control block BANK0_CONTROL.

Through the processes described above, when the command signals ACT_CMD and PCG_CMD are first enabled, the $0^{th}$ bank sequential signal BANK0_SEQUENTIAL having the plurality of enable periods that are sequential is generated and transferred to the $0^{th}$ bank control block BANK0_CONTROL. Through the same process as that of generating the $0^{th}$ bank sequential signal BANK0_SEQUENTIAL, the first bank sequential signal BANK1_SEQUENTIAL is generated and transferred to the first bank control block BANK1_CONTROL. That is, although all of processes are not directly described in figures, it is noted that the first bank sequential signal BANK1_SEQUENTIAL having the plurality of enable periods that are sequential is generated when the command signals ACT_CMD and PCG_CMD are enabled again after the command signals ACT_CMD and PCG_CMD are first enabled and then a predetermined time passes.

As described above, the circuit for controlling the operation of the semiconductor memory device including the plurality of banks in accordance with the embodiment of the present invention makes any one of the plurality of bank sequential signals BANK0_SEQUENTIAL-BANK7_SEQUENTIAL have the plurality of enable periods that are sequential in response that the command signals ACT_CMD and PCG_CMD are enabled in the bank sequential signal generating block 300 and makes the plurality of bank control blocks BANK0_CONTROL-BANK7_CONTROL generate the plurality of bank operation control signals BANK0_CONT<0:N>-BANK7_CONT<0:N> through simple counting and decoding operations, thereby allowing the plurality of banks BANK0-BANK7 to perform predetermined operations. That is, it is possible to prevent the increase of a whole area of the semiconductor memory device by implementing the plurality of bank control blocks BANK0_CONTROL-BANK7_CONTROL without a plurality of delay elements occupying a substantial area.

Furthermore, since the sequential enable periods of the plurality of bank sequential signals BANK0_SEQUENTIAL-BANK7_SEQUENTIAL are defined by the same delay elements, the timings where the active operation and the precharge operation for the plurality of banks BANK0-BANK7 are performed are more exactly consistent with each other.

In accordance with the embodiments of the present invention, since one control circuit controls operational timings of the active operation and the precharge operation that should be performed in the plurality of banks employed in the semiconductor memory device, it is possible to reduce the whole area of the semiconductor memory device.

Moreover, by generating signals for controlling the operational timings of the active operation and the precharge operation that should be performed in each of the plurality of banks employed by the semiconductor memory device through the same delay path, it is possible to make the timings where the active operation and the precharge operation performed for each of the plurality of banks be exactly consistent with each other.

While the present invention has been described with respect to the specific embodiments, it will be apparent to those skilled in the art that various changes and modifications may be made without departing from the spirit and scope of the invention as defined in the following claims.

For instance, the above illustrated logic gates and transistors may be implemented to have different locations and types according to polarities of signals inputted thereto.

What is claimed is:

1. A semiconductor memory device, comprising:
a plurality of banks, each configured to receive a bank operation control signal and perform predetermined operations in response to the received bank operation control signal;
a plurality of bank control blocks, each configured to receive a bank sequential signal and generate a plurality of bank operation control signals in response to enable periods of the received bank sequential signal; and
a bank sequential signal generating block configured to generate the plurality of bank sequential signals each having a multiplicity of enable periods that are sequential in response to a command signal.

2. The semiconductor memory device of claim 1, further comprising:
a bank operating signal enabling block configured to selectively enable a plurality of bank operating signals for activating the plurality of banks in response to bank addresses and to enable successively selected bank operating signals with a time interval longer than a predetermined time.

3. The semiconductor memory device of claim 2, wherein the command signal is enabled for a preset time whenever each of the bank operating signals has an enable period.

4. The semiconductor memory device of claim 3, wherein the bank sequential signal generating block allows the bank sequential signal corresponding to selected one of the plurality of bank operating signals to have a multiplicity of enable periods that are sequential in response to the command signal.

5. The semiconductor memory device of claim 4, wherein the bank sequential signal generating block includes:
a delayed command signal generating unit configured to generate a multiplicity of delayed command signals by serially delaying the command signal predetermined times; and
a bank sequential signal enable period determining unit configured to allow the plurality of bank sequential signals to have the multiplicity of enable periods that are sequential in response to the activation of the command signal and the plurality of delayed command signals.

6. The semiconductor memory device of claim 5, wherein the delayed command signal generating unit includes a predetermined number of delay elements that are connected to have a chain structure and serially delay the command signal to output each of the delayed command signals through each of the delay elements.

7. The semiconductor memory device of claim 5, wherein the bank sequential signal enable period determining unit allows a logic level of the corresponding bank sequential signal to be changed whenever the command signal and the multiplicity of delayed command signals are enabled.

8. The semiconductor memory device of claim 5, wherein the bank sequential signal enable period determining unit includes:
a number of pre-bank pulse generators configured to generate a pre-bank pulse in response to the command signal or the of delayed command signal when corresponding bank operating signal is enabled; and
a plurality of signal mergers configured to combine a multiplicity of pre-bank pulses generated from a multiplicity of pre-bank pulse generators and output the combined pulses as the bank sequential signal.

9. The semiconductor memory device of claim 8, wherein each of the pre-bank pulse generators includes:
a bank operation period signal generating element configured to generate a bank operation period signal that is enabled whenever the command signal or the delayed command signal is enabled in response to the bank operating signal or previous bank operation period signal inputted thereto; and a pre-bank pulse outputting element configured to output the pre-bank pulse in response to the command signal or the delayed command signal in each enable period of the bank operating signal or the previous bank operation period signal.

10. The semiconductor memory device of claim 8, wherein each of the signal mergers includes:

pulse serialization elements configured to output a pre-bank sequential signal by serializing the multiplicity of pre-bank pulses generated from the multiplicity of pre-bank pulse generators; and logic level changing elements configured to change a logic level of the bank sequential signal whenever the pre-bank sequential signal is enabled.

11. The semiconductor memory device of claim 10, wherein each of the logic level changing elements includes a T flip-flop to receive the pre-bank sequential signal and to output the bank sequential signal.

12. The semiconductor memory device of claim 1, wherein the plurality of bank control blocks includes:

a plurality of enable counters configured to count each enable period of the bank sequential signal; and a counting decoder configured to decode output signals of the plurality of enable counters and to change values of the bank operation control signal.

13. A semiconductor memory device, comprising:

a plurality of banks, each configured to receive a back operation control signal and perform predetermined operations in response to the received bank operation control signal;

a plurality of bank control blocks, each configured to receive a back sequential signal and generate a plurality of bank operation control signals in response to enable periods of the received bank sequential signal;

an active sequential signal generating block configured to generate a plurality of active sequential signals corresponding to the plurality of bank control blocks, wherein each of the plurality of active sequential signals has a multiplicity of enable periods that are sequential in response to an active command signal;

a precharge sequential signal generating block configured to generate a plurality of precharge sequential signals corresponding to the plurality of bank control blocks, wherein each of the plurality of precharge sequential signals has a multiplicity of enable periods that are sequential in response to a precharge command signal; and a bank sequential signal transferring block configured to serialize the plurality of active sequential signals and the plurality of precharge sequential signals and to transfer the serialized signals as the plurality of bank sequential signals to the plurality of bank control blocks.

14. The semiconductor memory device of claim 13, further comprising:

a bank operating signal enabling block configured to selectively enable a plurality of bank operating signals for activating the plurality of banks in response to bank addresses and to enable successively selected bank operating signals with a time interval longer than a predetermined time.

15. The semiconductor memory device of claim 14, wherein the active command signal or the precharge command signal is enabled for a preset time whenever each of the bank operating signals has an enable period.

16. The semiconductor memory device of claim 14, wherein the active sequential signal generating block allows the active sequential signal corresponding to selected one of the plurality of bank operating signals to have a multiplicity of enable periods that are sequential in response to the active command signal.

17. The semiconductor memory device of claim 16, wherein the active sequential signal generating block includes:

a delayed active command signal generating unit configured to generate a multiplicity of delayed active command signals by serially delaying the active command signal predetermined times; and an active sequential signal enable period determining unit configured to allow the plurality of active sequential signals to have the multiplicity of enable periods that are sequential in response to the activation of the active command signal and the plurality of delayed active command signals.

18. The semiconductor memory device of claim 17, wherein the delayed active command signal generating unit includes a predetermined number of delay elements that are connected to have a chain structure and serially delay the active command signal to output each of the delayed active command signals through each of the delay elements.

19. The semiconductor memory device of claim 17, wherein the active sequential signal enable period determining unit allows a logic level of the corresponding active sequential signal to be changed whenever the active command signal and the plurality of delayed active command signals are enabled.

20. The semiconductor memory device of claim 17, wherein the active sequential signal enable period determining unit includes:

a number of active pre-bank pulse generators configured to generate a active pre-bank pulses in response to the active command signal or the delayed active command signal when corresponding bank operating signals is enabled; and a plurality of active signal mergers configured to combine a multiplicity of active pre-bank pulses generated from a multiplicity of active pre-bank pulse generators and to output the combined pulses as the active sequential signal.

21. The semiconductor memory device of claim 20, wherein each of the active pre-bank pulse generators includes:

a bank operation period signal generating element configured to generate a bank operation period signal that is enabled whenever the active command signal or the delayed active command signal is enabled in response to the bank operating signal or previous bank operation period signal inputted thereto; and an active pre-bank pulse outputting element configured to output the active pre-bank pulse in response to the active command signal or the delayed active command signal in each enable period of the bank operation signal or the previous bank operation period signal.

22. The semiconductor memory device of claim 20, wherein each of the active signal mergers includes:

active pulse serialization elements configured to output a active pre-bank sequential signal by serializing the multiplicity of active pre-bank pulses generated from the multiplicity of active pre-bank pulse generators; and active signal logic level changing elements configured to change a logic level the active sequential signal whenever the active pre-bank sequential signal is enabled.

23. The semiconductor memory device of claim 22, wherein each of the active signal logic level changing elements includes a T flip-flop to receive the active pre-bank sequential signal and to output the active sequential signal.

24. The semiconductor memory device of claim 14, wherein the precharge sequential signal generating block allows the precharge sequential signal corresponding to selected one of the plurality of bank operating signals to have a multiplicity of enable periods that are sequential in response to the precharge command signal.

25. The semiconductor memory device of claim 24, wherein the precharge sequential signal generating block includes:
  a delayed precharge command signal generating unit configured to generate a multiplicity of delayed precharge command signals by serially delaying the precharge command signal predetermined times; and
  a precharge sequential signal enable period determining unit configured to allow the plurality of precharge sequential signals to have the multiplicity of enable periods that are sequential in response to the activation of the precharge command signal and the plurality of delayed precharge command signals.

26. The semiconductor memory device of claim 25, wherein the delayed precharge command signal generating unit includes a predetermined number of delay elements that are connected to have a chain structure and serially delay the precharge command signal to output each of the delayed precharge command signals through each of the delay elements.

27. The semiconductor memory device of claim 25, wherein the precharge sequential signal enable period determining unit allows a logic level of the corresponding precharge sequential signal to be changed whenever the precharge command signal and the plurality of delayed precharge command signals are enabled.

28. The semiconductor memory device of claim 25, wherein the precharge sequential signal enable period determining unit includes:
  a multiplicity of precharge pre-bank pulse generators configured to generate a precharge pre-bank pulses in response to the precharge command signal or the delayed precharge command signal when corresponding bank operating signal is enabled; and
  a plurality of precharge signal mergers configured to combine a multiplicity of precharge pre-bank pulses generated from a multiplicity of precharge pre-bank pulse generators and to output the combined pulses as the precharge sequential signal.

29. The semiconductor memory device of claim 28, wherein each of the precharge pre-bank pulse generators includes:
  a bank operation period signal generating element configured to generate a bank operation period signal that is enabled whenever the precharge command signal or the delayed precharge command signal is enabled in response to the bank operating signal or previous bank operation period signal inputted thereto; and
  a precharge pre-bank pulse outputting element configured to output the precharge pre-bank pulse in response to the precharge command signal or the delayed precharge command signal in each enable period of the bank operating signal or the previous bank operation period signal.

30. The semiconductor memory device of claim 28, wherein each of the precharge signal mergers includes:
  a precharge pulse serialization elements configured to output a precharge pre-bank sequential signal by serializing the multiplicity of precharge pre-bank pulses generated from the multiplicity of precharge pre-bank pulse generators; and
  precharge signal logic level changing elements configured to change a logic level of the precharge sequential signal whenever the precharge pre-bank sequential signal is enabled.

31. The semiconductor memory device of claim 30, wherein each of the precharge signal logic level changing elements includes a T flip-flop to receive the precharge pre-bank sequential signal and to output the precharge sequential signal.

32. The semiconductor memory device of claim 13, wherein the plurality of bank control blocks includes:
  a plurality of enable counters configured to count each enable period of the bank sequential signal; and
  a counting decoder configured to decode output signals of the plurality of enable counters and to change values of the bank operation control signal.

* * * * *